US008175566B2

(12) United States Patent
Tasic et al.

(10) Patent No.: US 8,175,566 B2
(45) Date of Patent: May 8, 2012

(54) MULTIPLE MULTI-MODE LOW-NOISE AMPLIFIER RECEIVER WITH SHARED DEGENERATIVE INDUCTORS

(75) Inventors: Aleksandar M. Tasic, San Diego, CA (US); Marco Cassia, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 371 days.

(21) Appl. No.: 12/478,675

(22) Filed: Jun. 4, 2009

(65) Prior Publication Data
US 2010/0311378 A1    Dec. 9, 2010

(51) Int. Cl.
*H04B 1/10*    (2006.01)
(52) U.S. Cl. ...... 455/311; 455/130; 455/296; 330/124 R
(58) Field of Classification Search .............. 455/130, 455/341, 78, 24, 73, 296, 311; 330/296, 330/289, 311, 305, 126, 295, 129, 279, 302, 330/124 R, 125, 124 D; 323/322, 267
See application file for complete search history.

(56) References Cited

U.S. PATENT DOCUMENTS

| | | | | |
|---|---|---|---|---|
| 5,300,894 | A * | 4/1994 | Myer et al. ........... | 330/129 |
| 7,486,135 | B2 | 2/2009 | Mu | |
| 7,756,486 | B1 * | 7/2010 | Tan et al. ................ | 455/73 |
| 2002/0084855 | A1 * | 7/2002 | Kwon et al. ............ | 330/311 |
| 2004/0145415 | A1 * | 7/2004 | Sun ........................ | 330/295 |
| 2004/0246051 | A1 | 12/2004 | Hsu et al. | |
| 2005/0176399 | A1 | 8/2005 | Aparin | |
| 2005/0231290 | A1 * | 10/2005 | Hung et al. ............ | 330/311 |
| 2006/0035600 | A1 * | 2/2006 | Lee et al. ............... | 455/78 |
| 2008/0096516 | A1 * | 4/2008 | Mun et al. .............. | 455/341 |
| 2008/0139156 | A1 * | 6/2008 | Behzad et al. .......... | 455/296 |

(Continued)

FOREIGN PATENT DOCUMENTS
EP    1693957    8/2006
(Continued)

OTHER PUBLICATIONS

Multi-mode, multi-band RF transceiver circuits for mobile terminals in deep-submicron CMOS processes, by Bakkaloglu, B.; Fontaine, P.A.; Radio Frequency integrated Circuits (RFIC) Symposium, 2005. Digest of Papers. 2005 IEEE, Issue Date: Jun. 12-14, 2005, pp. 483-486, ISBN: 0-7803-8983-2.*

(Continued)

*Primary Examiner* — Lana N Le
*Assistant Examiner* — Golam Sorowar
(74) *Attorney, Agent, or Firm* — Ramin Mobarhan

(57) ABSTRACT

A device with multiple multi-mode low-noise amplifiers (LNAs), each with common operating modes and separate operating frequency bands, are coupled to shared degenerative inductors for common operating modes. Common load inductors are coupled to the multi-mode LNA outputs to reduce the number of load inductors required. The multi-mode LNAs have parallel transistor gain stages and form part of an integrated circuit (IC) for use in a wireless communication receiver. Each multi-mode LNA has the capability to switch between at least one higher linearity transistor gain stage and at least one lower linearity transistor gain stage for different operating modes. Multiple lower linearity transistor gain stages for different multi-mode LNAs may be merged into a single lower linearity transistor gain stage shared among multiple multi-mode LNAs through multiple RF switches between a set of common RF inputs and common inputs and common input matching networks.

17 Claims, 4 Drawing Sheets

U.S. PATENT DOCUMENTS

| | | | |
|---|---|---|---|
| 2008/0297259 A1* | 12/2008 | Mu | 330/296 |
| 2009/0085668 A1 | 4/2009 | Gao et al. | |
| 2009/0174460 A1* | 7/2009 | Chan et al. | 327/356 |

FOREIGN PATENT DOCUMENTS

| | | |
|---|---|---|
| WO | WO0141302 | 6/2001 |
| WO | WO2008145604 A1 | 12/2008 |
| WO | WO2009100387 | 8/2009 |

OTHER PUBLICATIONS

Integrated circuits for multiband multimode receivers, by Ryynanen, J.; Lindfors, S.; Stadius, K.; Halonen, K.A.I.; Circuits and Systems Magazine, IEEE,Issue Date: 2006 , pp. 5-16, ISSN: 1531-636X.*

Multi-Standard Mobile Broadcast Receiver LNA With Integrated Selectivity and Novel Wideband Impedance Matching Technique, byTae Wook Kim; Muthali, H.; Sengupta, S.; Barnett, K.; Jaffee, J.; Solid-State Circuits, IEEE Journal of, Issue Date: Mar. 2009, pp. 675-685, ISSN: 0018-9200.*

Che-Sheng Chen et al: "A 2.5GHz 90nm CMOS Triple Gain Mode LNA for WiMAX Applications" Signals, Systems and Electronics, 2007. Issse 07. International Symposium on, IEEE, PI, Jul. 1, 2007, pp. 367-369, XP031129290 ISBN: 978-1-4244-1448-2 p. 367, left-hand column, line 15—p. 368, right-hand column, line 11; figures 2-4.

International Search Report and Written Opinion—PCT/US2010/037528, International Search Authority—European Patent Office—Oct. 19, 2010.

* cited by examiner

MULTIPLE MULTI-MODE LOW-NOISE AMPLIFIER RECEIVER WITH SHARED DEGENERATIVE INDUCTORS

TECHNICAL FIELD

The present disclosure relates generally to electronics, and more specifically to a multi-mode low-noise amplifiers for wireless communication receivers.

BACKGROUND

There is a need for multiple multi-mode (MMM) low-noise amplifiers (LNAs) for use in radio frequency (RF) wireless communication receiver integrated circuits (ICs), which provide optimal linearity for different operating modes and operating RF bands without impacting IC die area. MMM LNAs may employ multiple transistor gain stages (utilizing RF bipolar or RF field-effect transistors) along with multiple passive components (e.g., inductors) in the input RF matching networks and output RF loads that may occupy a large integrated circuit die area, particularly for lower RF operating bands (450 MHz for example). In addition, each mode of the MMM LNAs may require a separate degenerative inductor between each transistor gain stage and an external ground connection to improve linearity. The value of each degenerative inductor is dependent on the corresponding MMM LNA operating mode gain and linearity required, and may change for different MMM LNA operating modes and MMM LNA radio frequency operating bands.

Wireless communication receiver and LNA operating modes may include different air-interface standards such as GSM, CDMA, and/or WCDMA in the same operating frequency band (US-Cellular receive or US-PCS receive for example, 869-894 MHz or 1930-1990 MHz). Within each air interface standard, the LNA linearity required may change as a function of receive signal strength in the presence of interference (jamming) or whether the transmitter is on or off while attempting to receive weak signals (transmit to receive cross modulation in CDMA mode). In the case of the US-Cellular CDMA air-interface standard, there are three distinct receiver linearity requirements that may require three LNA modes, each with a different gain and linearity requirement. If GSM and WCDMA are also required in the same operating frequency band for the same wireless communication receiver, then a number of degenerative inductors for MMM LNAs will increase proportionally and the overall wireless communication receiver integrated circuit (IC) die area will also increase significantly if the MMM LNAs are integrated.

In the known art, MMM LNA integrated circuit area may be reduced by sharing common load inductors among multiple operating modes and multiple operating frequency bands with corresponding transistors that connect to a common MMM LNA output signal path. However, there may be a corresponding degenerative inductor for each LNA mode to optimize linearity for individual MMM LNA operating modes. In addition, as more operating frequency bands are added to the wireless communication device, the number of multi-mode LNAs and design complexity increases along with the number of degenerative inductors. Furthermore, if each multi-mode LNA is designed as a differential circuit, the number of degenerative inductors doubles. Unfortunately, each additional degenerative inductor impacts overall wireless communication receiver integrated circuit (IC) die area, layout complexity, and RF signal routing.

DETAILED DESCRIPTION

Figure 1:
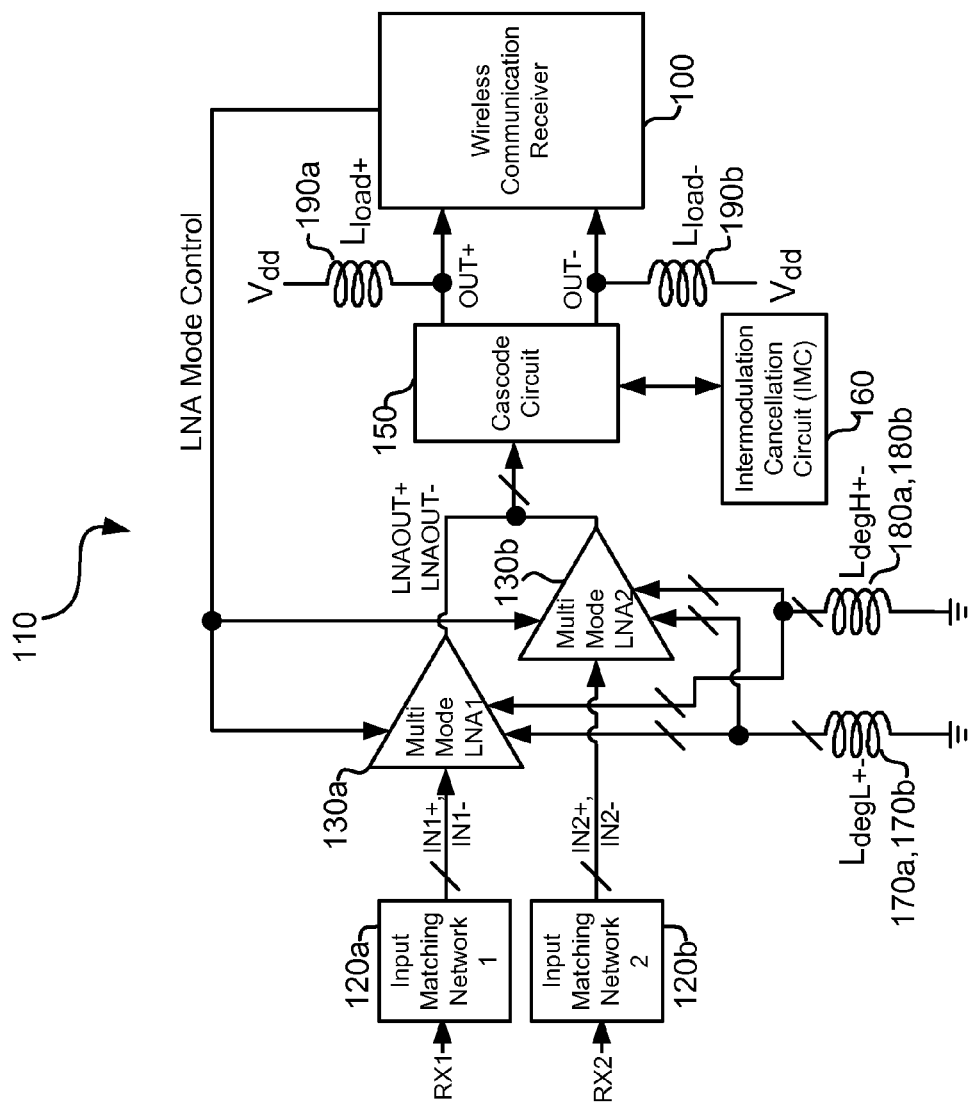
FIG. 1 is a block diagram of a MMM LNA in accordance with an exemplary embodiment shown with two multi-mode LNAs, each having independent signal inputs, coupled outputs and shared high and low degenerative inductors.

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

In an exemplary embodiment, multiple multi-mode (MMM) low-noise amplifiers (LNAs), each with common operating modes and separate operating frequency bands, are coupled to shared degenerative inductors for common operating modes. In a further embodiment, common load inductors are coupled to all the MMM LNAs outputs to reduce the number of load inductors required. In a further exemplary embodiment, the MMM LNAs, having parallel transistor gain stages, are part of an integrated circuit (IC) including a wireless communication receiver. Each multi-mode LNA has the capability to switch between at least one higher linearity transistor gain stage and at least one lower linearity transistor gain stage for different operating modes.

MMM LNAs IC die area may be minimized and layout symmetry with respect to shared degenerative inductors and common load inductors may be optimized. In addition, MMM LNA IC signal routing may be shortened by interweaving at least one higher linearity transistor gain stage and at least one lower linearity transistor gain stage around shared degenerative inductors and common load inductors. In a further embodiment, multiple lower linearity transistor gain stages for different MM LNAs may be merged into a single lower linearity transistor gain stage shared among MMM LNAs through multiple RF switches between a set of common RF inputs and common inputs and common input matching networks of MMM LNAs.

In other exemplary embodiments, the MMM LNAs are implemented with RF complementary metal-oxide silicon (RF-CMOS) transistor gain stages. Each transistor gain stage may be implemented as a differential transistor pair. In yet another embodiment, the MMM LNAs share a single cascode circuit and a single inter-modulation cancellation (IMC) circuit to reduce the number of transistors and passive components in the MMM LNAs output.

Sharing of a degenerative inductor among different LNAs in high-linearity modes, as proposed herein, is a step towards a full integration of a multi-band/multi-mode/multi-standard receiver in a single signal-processing receive path. Advantages of using a single degenerative inductor for multiple amplifiers in high-linearity modes of operation are manifold. For example, silicon area can be reduced, and layout symmetry with respect to the shared degenerative and load inductors can be improved. Further, interweaving the multiple transistors/amplifiers around the shared inductors can shorten routing, thus reducing area and improving performance. Further, multiple low-linearity mode amplifiers could be merged into a single low-linearity mode LNA through multiple switches between multiple inputs and matching networks of a multi-mode receiver, thus resulting in further die area and cost savings.

FIG. 1 is a block diagram of a MMM LNA 110 in accordance with an exemplary embodiment shown with two multi-mode LNAs 130a, 130b, each having independent signal inputs, coupled outputs and shared high and low degenerative inductors 170a, 170b, 180a, 180b.

The first input receiver signal RX1 is coupled to the first input terminal of input matching network 1 120a. The output terminal of matching network 1 120a is coupled to the input terminal of multi-mode LNA1 130a. The output signal of input matching network 1 120a is a differential signal represented by the difference between the two signals IN1+ and IN1−. Similarly, the second input receiver signal RX2 is coupled to the first input terminal of input matching network 2 120b. The output terminal of matching network 2 120b is coupled to the input terminal of LNA2 130b. The output signal of input matching network 2 120b is a differential signal represented by the difference between the two signals IN2+ and IN2−. Input matching is a method of maximizing the power transferred from the receiving antenna to the amplifier circuit. By adjusting the input impedance of the matching network to "match" the output impedance from the antenna, while simultaneously adjusting the output impedance of the matching network to "match" the input impedance of the amplifier circuit, the amount of power transferred from the receiving antenna to the amplifier circuit may be maximized.

It is also noted herein, multiple input matching networks may be coupled to a single multi-mode LNA circuit by way of multiple single-pole single-throw (SPST) RF switches. For example, when utilizing a single multi-mode LNA capable of varying input frequencies, it may be necessary to use a different input matching network to maximize transferred energy from the receiving antenna to the LNA circuit.

In a device where different antennas for different modes of operation are utilized, a unique input matching network to match the impedance of a different antenna may be required. It should be appreciated that multiple input matching networks may be coupled or decoupled by use of SPST RF switches. The switches may, for example, be controlled by wireless communication receiver 100. However, one skilled in the art will realize that many other methods for controlling the SPST RF switches exist, such as use of an application processor.

A first terminal of low linearity degenerative inductors 170a and 170b are coupled to both a second input terminal of multi-mode LNA1 130a and a second input terminal of multi-mode LNA2 130b. A second terminal of low linearity degenerative inductors 170a and 170b are coupled to ground. Low linearity degenerative inductor 170a provides the degenerative effect for positive input signal circuits within multi-mode LNAs 130a and 130b when operating in a low linearity mode of operation. Low linearity inductor 170b provides the degenerative effect for negative input signal circuits within multi-mode LNAs 130a and 130b when operating in a low linearity mode of operation.

A first terminal of high linearity degenerative inductors 180a and 180b are coupled to both a third input terminal of multi-mode LNA1 130a and a third input terminal of multi-mode LNA2 130b. A second terminal of high linearity degenerative inductors 180a and 180b are coupled to ground. High linearity degenerative inductor 180a provides the degenerative effect for positive input signal circuits within multi-mode LNAs 130a and 130b when operating in a high linearity mode of operation. High linearity inductor 180b provides the degenerative effect for negative input signal circuits within multi-mode LNAs 130a and 130b when operating in high linearity mode of operation.

Degenerative inductors 170a, 170b, 180a and 180b provide inductive source degeneration. Inductive source degeneration utilizes an inductor coupled to the source terminal of a transistor to cause the current flow to lag behind the voltage applied to the gate terminal of the transistor. This provides control over the real part of the input impedance seen at the input gate of the transistor/amplifier. The inductively degenerated common-source transistor/amplifier input impedance may be expressed as follows:

$$Z_{in} = sL + \frac{1}{sC_{gs}} + \frac{g_m}{C_{gs}}L \cong sL + \frac{1}{sC_{gs}} + w_T L \qquad \text{Eq. (1)}$$

where, $s=jw$, $C_{gs}$ is the gate to source capacitance, $g_m$ is the transistor transconductance and L is the inductance value of the degenerative inductor. It should also be noted that any capacitance seen at the source terminal of the transistor may create capacitive degeneration, which provides a negative resistance contribution to the transistor input impedance. Therefore, any source to substrate capacitance offsets the positive resistance from inductive degeneration. Thus, it is important to take this effect into account in any radio frequency amplifier design.

The output terminals of multi-mode LNA1 130a and multi-mode LNA2 130b are both coupled to the input terminal of cascode circuit 150. An input/output terminal of cascode circuit 150 is coupled to the input/output terminal of inter-modulation cancellation circuit 160. Cascode circuit 150 has a differential output signal. A positive component of the cascode circuit 150 output signal OUT+ is coupled to a positive input terminal of wireless communication receiver 100. A negative component of the cascode circuit 150 output signal OUT− is coupled to a negative input terminal of wireless communication receiver 100. A first terminal of load inductance 190a is coupled to the positive output terminal of cascode circuit 150. A second terminal of load inductance 190a is coupled to Vdd. A first terminal of load inductance 190b is coupled to the negative output terminal of cascode circuit 150. A second terminal of load inductance 190b is coupled to Vdd. A first output terminal of wireless communication receiver 100 is coupled to a fourth input terminal of multi-mode LNAs 130a and 130b. Via this connection, the wireless communication receiver may control which modes the multi-mode LNAs 130a and 130b operate in. Thus, the wireless communication receiver may control which degenerative inductors are utilized by multi-mode LNAs 130a and 130b.

It is noted herein, the at the transistors used to implement the circuit blocks shown in FIG. 1 may be any transistor technology known in the art, such as bipolar junction transistors (BJT) or complimentary metal-oxide semiconductor (CMOS) transistors.

Figure 2:
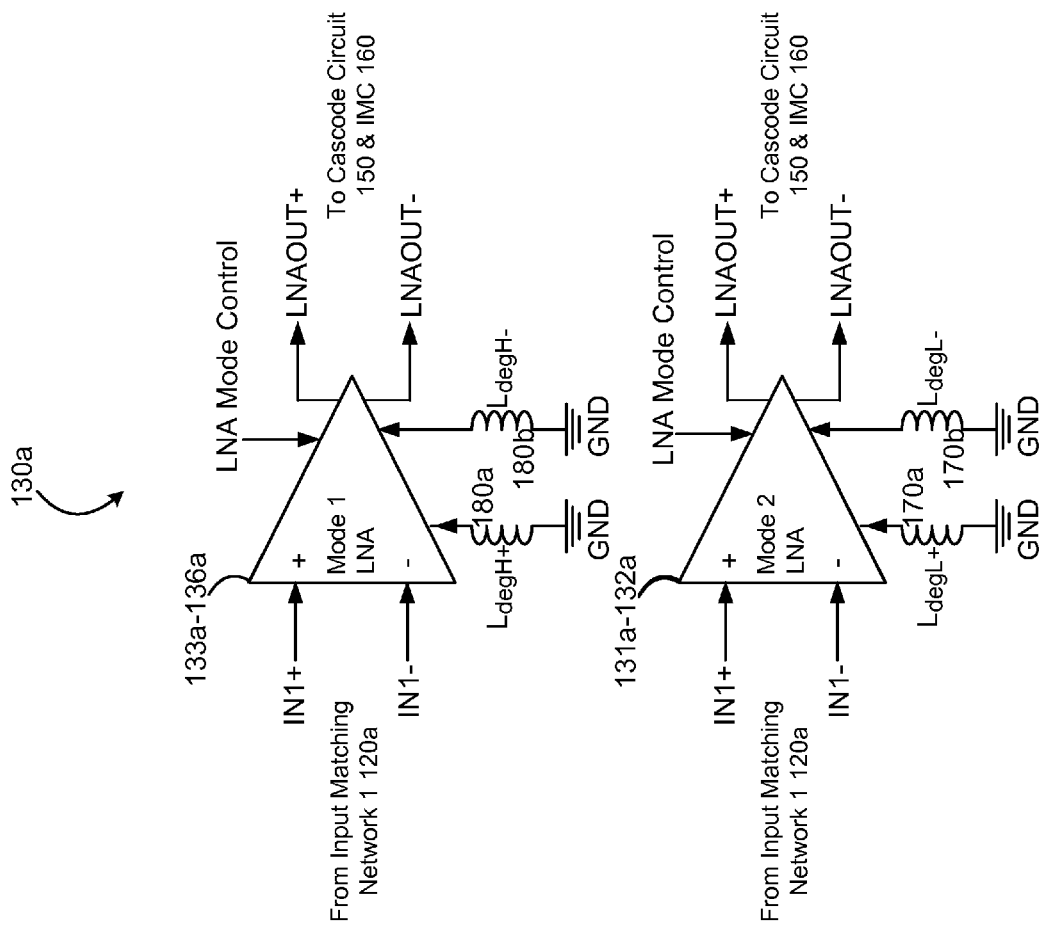
FIG. 2 is a detailed block diagram of a multi-mode LNA shown in FIG. 1 utilizing high linearity degenerative inductors $180a$, $180b$ when operating in Mode 1 and low linearity degenerative inductors $170a$, $170b$ when operating in Mode 2.

FIG. 2 is a detailed block diagram of the multi-mode LNA 130a shown in FIG. 1 utilizing high linearity degenerative inductors 180a, 180b when operating in Mode 1 and low linearity degenerative inductors 170a, 170b when operating in Mode 2.

Positive input signal IN1+ is coupled to the positive input terminal of LNAs 133a-136a. Negative input signal IN1− is coupled to the negative input terminal of LNAs 133a-136a. The first terminal of high linearity inductor 180a is coupled to a third input terminal of LNAs 133a-136a. The second terminal of high linearity inductor 180a is coupled to ground. The first terminal of high linearity inductor 180b is coupled to a fourth input terminal of LNA 133a-136a. The second terminal of high linearity inductor 180b is coupled to ground. LNA mode control signal is coupled to a fifth input of LNAa 133a-136a. The LNA mode control signal is created by wireless communication receiver 100, shown in FIG. 1. LNAs 133a-136a provide a differential output signal. The positive component of the LNA output signal is LNAOUT+. The negative component of the LNA output signal is LNAOUT−. LNA differential output signal is coupled to cascode circuit 150 and inter-modulation cancellation circuit (ICC) 160, both shown in FIG. 1.

Similarly, positive input signal IN1+ is coupled to the positive input terminal of LNAs 131a-132a. Negative input signal IN1− is coupled to the negative input terminal of LNAs 131a-132a. The first terminal of high linearity inductor 170a is coupled to a third input terminal of LNAs 131a-132a. The second terminal of high linearity inductor 170a is coupled to ground. The first terminal of high linearity inductor 170b is coupled to a fourth input terminal of LNA 131a-132a. The second terminal of high linearity inductor 170b is coupled to ground. LNA mode control signal is coupled to a fifth input of LNAs 131a-132a. The LNA mode control signal is created by wireless communication receiver 100, shown in FIG. 1. LNAs 131a-132a provide a differential output signal. The positive component of the LNA output signal is LNAOUT+. The negative component of the LNA output signal is LNAOUT−. LNA differential output signal is coupled to cascode circuit 150 and inter-modulation cancellation circuit (ICC) 160, both shown in FIG. 1.

FIG. 2 Illustrates how two high linearity inductors 180a and 180b are shared between multiple high linearity LNAs 133a-136a. Similarly, FIG. 2 illustrates how two low linearity inductors 170a and 170b are shared between multiple low linearity LNAs 131a and 132a. Further, a single input matching network is utilized to provide a high power transfer to both high and low linearity amplifiers 131a-136a. The shared approach provides substantial reduced die size and cost. For example, without this exemplary sharing topology the suggested circuit would require two inductors per LNA, as well as a unique input matching network for each LNA.

It is noted herein, the at the transistors used to implement the circuit blocks shown in FIG. 2 may be any transistor technology known in the art, such as bipolar junction transistors (BJT) or complimentary metal-oxide semiconductor (CMOS) transistors.

Figure 3:
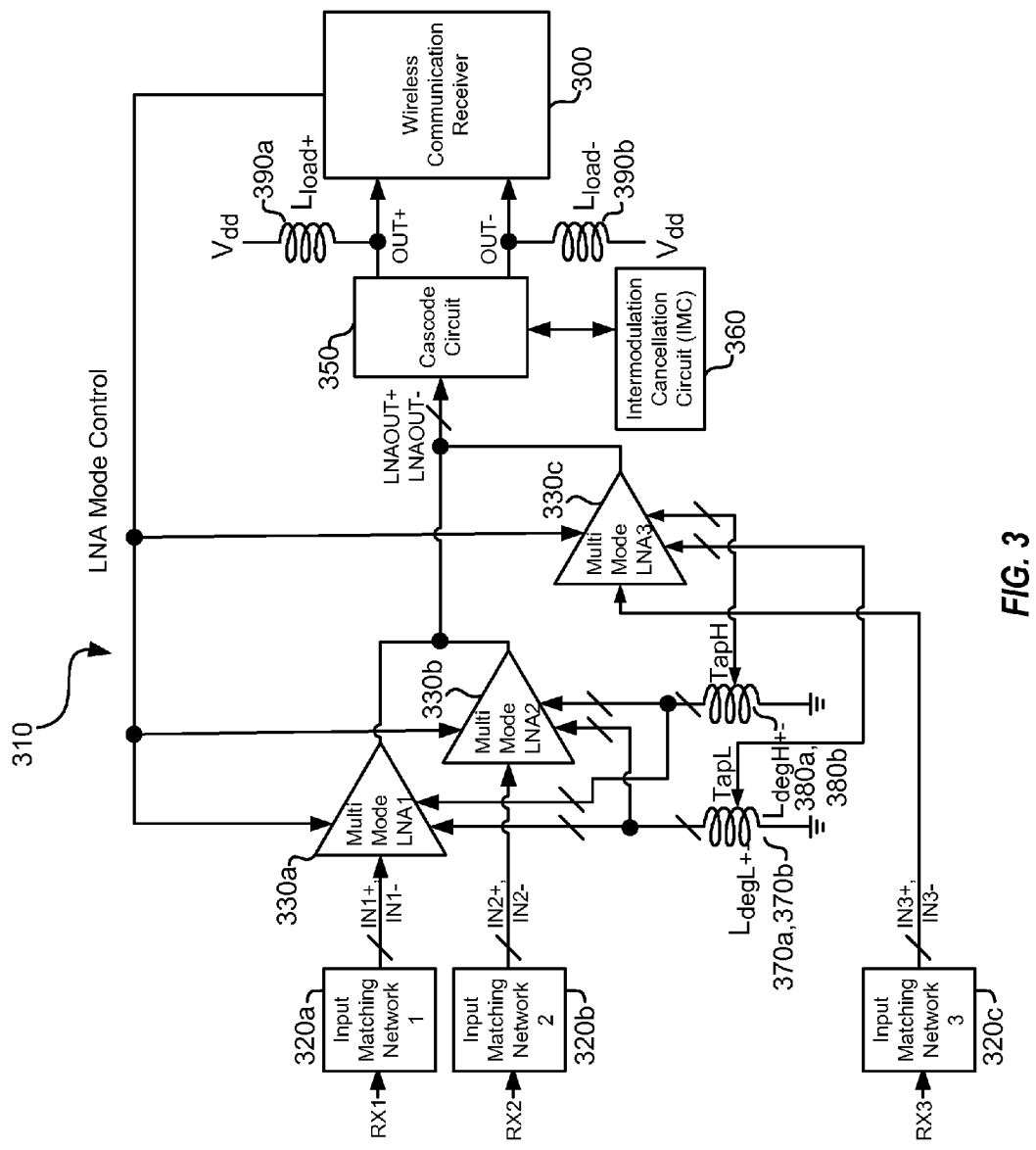
FIG. 3 is a block diagram of a MMM LNA in accordance with a second exemplary embodiment shown with three multi-mode LNAs $330a$, $330b$, $330c$, each having independent signal inputs, coupled outputs and shared high and low degenerative inductors $370a$, $370b$, $380a$, $380b$.

FIG. 3 is a block diagram of a MMM LNA in accordance with a second exemplary embodiment shown with three multi-mode LNAs 330a, 330b, 330c, each having independent signal inputs, coupled outputs and shared high and low degenerative inductors 370a, 370b, 380a, 380b.

The first input receiver signal RX1 is coupled to the first input terminal of input matching network 1 320a. The output terminal of matching network 1 320a is coupled to the input terminal of multi-mode LNA1 330a. The output signal of input matching network 1 320a is a differential signal represented by the difference between the two signals IN1+ and IN1−.

The second input signal RX2 is coupled to the first input terminal of input matching network 2 320b. The output terminal of matching network 2 320b is coupled to the input terminal of LNA2 330b. The output signal of input matching network 2 320b is a differential signal represented by the difference between the two signals IN2+ and IN2−.

The third input signal RX3 is coupled to the first input terminal of input matching network 3 320c. The output terminal of matching network 3 320c is coupled to the input terminal of LNA2 330c. The output signal of input matching network 3 320c is a differential signal represented by the difference between the two signals IN3+ and IN3−.

Input matching is a method of maximizing the power transferred from the receiving antenna to the amplifier circuit. By adjusting the input impedance of the matching network to "match" the output impedance from the antenna, while simultaneously adjusting the output impedance of the matching network to "match" the input impedance of the amplifier circuit, the amount of power transferred from the receiving antenna to the amplifier circuit may be maximized.

It is also noted herein, multiple input matching networks may be coupled to a single multi-mode LNA circuit by way of multiple single-pole single-throw (SPST) RF switches. For example, when utilizing a single multi-mode LNA for varying input frequencies, it may be necessary to use a different input matching network to maximize transferred energy from the receiving antenna to the LNA circuit. In another example, in a situation where a device utilized different antenna for different modes of operation. Thus, requiring a unique input matching network to match the impedance of a different antenna. In any scenario, multiple input matching networks may be coupled or decoupled by use of SPST RF switches. The switches may, for example, be controlled by wireless communication receiver 300. However, one skilled in the art will realize that many other methods for controlling the SPST RF switches exist, such as use of an application processor.

A first terminal of low linearity degenerative inductors 370a and 370b are coupled to both a second input terminal of multi-mode LNA1 330a and a second input terminal of multi-mode LNA2 330b. A tapped terminal of low linearity degenerative inductors 370a and 370b are coupled to a second input of multi-mode LNA3 330c. A third terminal of low linearity degenerative inductors 370a and 370b are coupled to ground.

Low linearity degenerative inductor 370a provides the degenerative effect for positive input signal circuits within multi-mode LNAs 330a, 330b and 330c when operating in a low linearity mode of operation. Low linearity inductor 370b provides the degenerative effect for negative input signal circuits within multi-mode LNAs 330a, 330b and 330c when operating in a low linearity mode of operation.

A first terminal of high linearity degenerative inductors 380a and 380b are coupled to both a third input terminal of multi-mode LNA1 330a and a third input terminal of multi-mode LNA2 330b. A tapped terminal of high linearity degenerative inductors 380a and 380b are coupled to a third input of multi-mode LNA3 330c. A third terminal of high linearity degenerative inductors 380a and 380b are coupled to ground.

High linearity degenerative inductor 380a provides the degenerative effect for positive input signal circuits within multi-mode LNAs 330a, 330b and 330c when operating in a high linearity mode of operation. High linearity inductor 380b provides the degenerative effect for negative input signal circuits within multi-mode LNAs 330a, 330b and 330c when operating in high linearity mode of operation.

Degenerative inductors 370a, 370b, 380a and 380b provide inductive source degeneration. Inductive source degeneration utilizes an inductor coupled to the source terminal of a transistor to cause the current flow to lag behind the voltage applied to the gate terminal of the transistor. This provides control over the real part of the input impedance seen at the input gate of the transistor/amplifier. As described above, the inductively degenerated common-source transistor/amplifier input impedance may be expressed as follows:

$$Z_{in} = sL + \frac{1}{sC_{gs}} + \frac{g_m}{C_{gs}}L \cong sL + \frac{1}{sC_{gs}} + w_T L \quad \text{Eq. (2)}$$

where, s=jw, $C_{gs}$ is the gate to source capacitance, $g_m$ is the transistor transconductance and L is the inductance value of the degenerative inductor. It should also be noted that any capacitance seen at the source terminal of the transistor may create capacitive degeneration, which provides a negative resistance contribution to the transistor input impedance. Therefore, any source to substrate capacitance offsets the positive resistance from inductive degeneration. Thus, it is important to take this effect into account in any radio frequency amplifier design.

The output terminals of multi-mode LNA1 330a, LNA2 330b and LNA3 130b are all coupled to the input terminal of cascode circuit 350. An input/output terminal of cascode circuit 350 is coupled to the input/output terminal of intermodulation cancellation circuit 360. Cascode circuit 350 has a differential output signal. A positive component of the cascode circuit 350 output signal OUT+ is coupled to a positive input terminal of wireless communication receiver 300. A negative component of the cascode circuit 350 output signal OUT− is coupled to a negative input terminal of wireless communication receiver 300. A first terminal of load inductance 390a is coupled to the positive output terminal of cascode circuit 350. A second terminal of load inductance 390a is coupled to Vdd. A first terminal of load inductance 390b is coupled to the negative output terminal of cascode circuit 350. A second terminal of load inductance 390b is coupled to Vdd. A first output terminal of wireless communication receiver 300 is coupled to a fourth input terminal of multi-mode LNAs 330a, 330b and 330c. Via this connection, the wireless communication receiver may control which modes the multi-mode LNAs 330a, 330b and 330c operate in. Thus, the wireless communication receiver may control which degenerative inductors are utilized by multi-mode LNAs 330a, 330b and 330c.

FIG. 3 shows a topology which utilizes tapping of an existing degenerative inductor to provide a reduced inductance value to allow an LNA to cover a higher frequency range. At lower frequencies, LNAs provide better performance, such as 1/f noise, matching and gain, when a larger degenerative inductor values are used. Conversely, at higher frequencies LNAs provide better performance when small degenerative inductor values are used. To this end, FIG. 3 shows how LNA3 330c is provided a smaller degenerative inductance value by tapping existing degenerative inductors 370a, 370b, 380a and 380b. Thus, providing improved performance and frequency coverage without requiring the addition of a single inductor.

It is noted herein, the at the transistors used to implement the circuit blocks shown in FIG. 3 may be any transistor technology known in the art, such as bipolar junction transistors (BJT) or complimentary metal-oxide semiconductor (CMOS) transistors.

Figure 4:
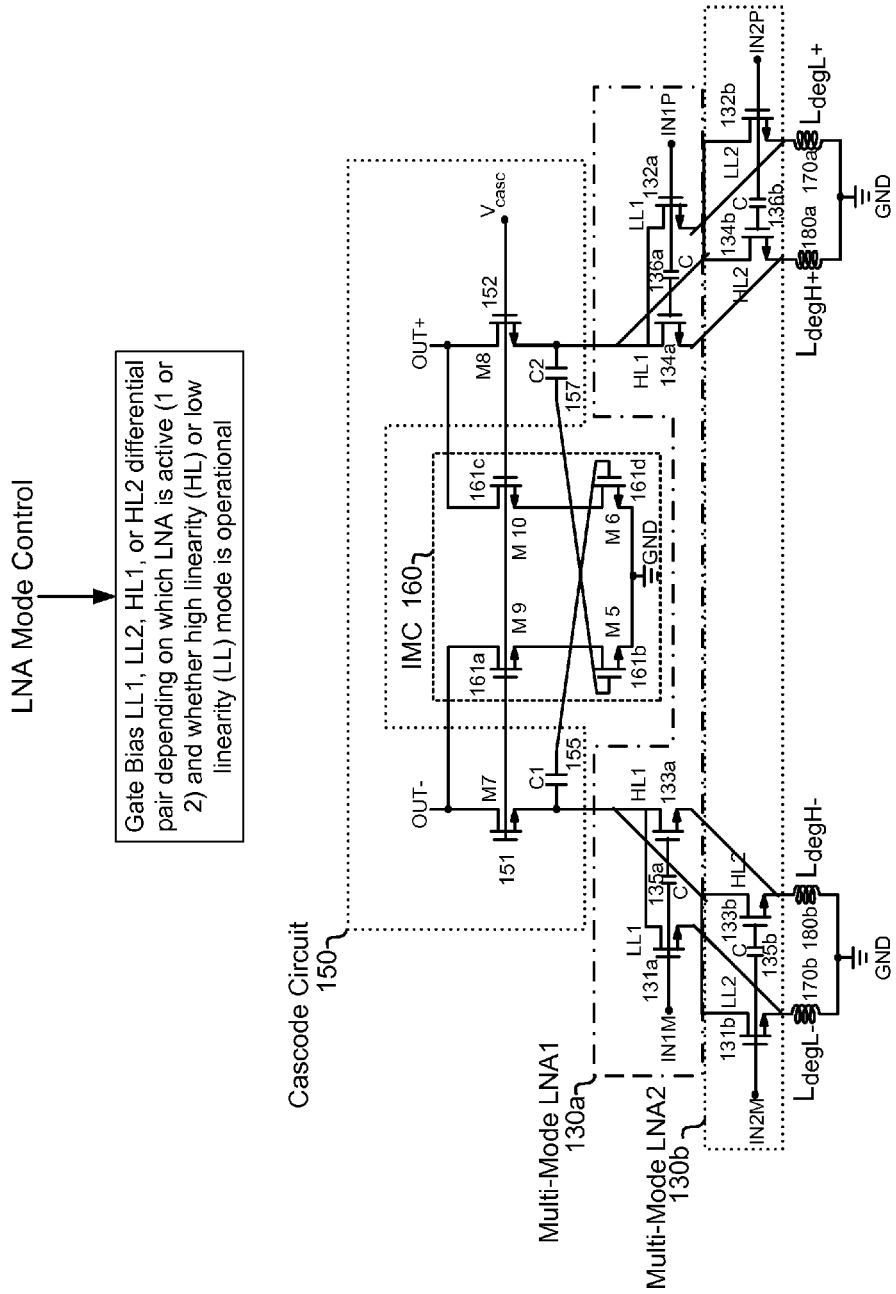
FIG. 4 is an exemplary circuit schematic of cascode circuit 150, multi-mode LNA1 $130a$ and multi-mode LNA2 $130b$ shown in FIG. 1.

FIG. 4 is an exemplary circuit schematic of cascode circuit 150, multi-mode LNA 1 130a and multi-mode LNA2 130b shown in FIG. 1.

Multi-mode LNA2 130b comprises four transistors coupled in a cascode configuration with inductive degeneration.

Input signal IN2M is coupled to the base terminal of transistor 131b and a first terminal of capacitor 135b. A second terminal of capacitor 135b is coupled to the base terminal of transistor 133b. The source terminal of transistor 131b is coupled to a first terminal of degenerative inductor 170b. The second terminal of degenerative inductor 170b is coupled to ground. The source terminal of transistor 133b is coupled to a first terminal of degenerative inductor 180b. The second terminal of degenerative inductor 180b is coupled to ground. The drain terminal of transistor 131b is coupled to the drain terminal of transistor 133b.

Input signal IN2P is coupled to the base terminal of transistor 132b and a first terminal of capacitor 136b. A second terminal of capacitor 136b is coupled to the base terminal of transistor 134b. The source terminal of transistor 132b is coupled to a first terminal of degenerative inductor 170a. The second terminal of degenerative inductor 170a is coupled to ground. The source terminal of transistor 134b is coupled to a first terminal of degenerative inductor 180a. The second terminal of degenerative inductor 180a is coupled to ground. The drain terminal of transistor 132b is coupled to the drain terminal of transistor 134b.

Multi-mode LNA1 130a comprises four transistors coupled in a cascode configuration with inductive degeneration.

Input signal IN1M is coupled to the base terminal of transistor 131a and a first terminal of capacitor 135a. A second terminal of capacitor 135a is coupled to the base terminal of transistor 133a. The source terminal of transistor 131a is coupled to a first terminal of degenerative inductor 170b. The second terminal of degenerative inductor 170b is coupled to ground. The source terminal of transistor 133a is coupled to a first terminal of degenerative inductor 180b. The second terminal of degenerative inductor 180b is coupled to ground. The drain terminal of transistor 131a is coupled to the drain terminal of transistor 133a.

Input signal IN1P is coupled to the base terminal of transistor 132a and a first terminal of capacitor 136a. A second terminal of capacitor 136a is coupled to the base terminal of transistor 134a. The source terminal of transistor 132a is coupled to a first terminal of degenerative inductor 170a. The second terminal of degenerative inductor 170a is coupled to ground. The source terminal of transistor 134a is coupled to a first terminal of degenerative inductor 180a. The second terminal of degenerative inductor 180a is coupled to ground. The drain terminal of transistor 132a is coupled to the drain terminal of transistor 134a.

Cascode circuit 150 comprises two transistors coupled in a cascode configuration.

Bias voltage $V_{casc}$ is coupled to the base terminal of transistors 152 and 151. The source terminal of transistor 151 is coupled to a first terminal of capacitor 155. The source terminal of transistor 152 is coupled to a first terminal of capacitor 157. The drain terminal of 152 is coupled to output terminal OUT+. The drain terminal of 151 is coupled to terminal OUT−.

Inter-modulation cancellation circuit (IMC) comprises four transistors coupled in a cross-quad configuration.

$V_{casc}$ is coupled to the base terminal of transistor 161*a* and 161*c*. The drain terminal of transistor 161*c* is coupled to output terminal OUT+. The drain terminal of transistor 161*a* is coupled to output terminal OUT−. The source terminal of transistor 161*a* is coupled to the drain terminal of transistor 161*b*. The source terminal of transistor 161*c* is coupled to the drain terminal of transistor 161*d*. The source terminal of transistors 161*b* and 161*d* are coupled to ground. The base terminal of transistor 161*b* is coupled to a second terminal of capacitor 157. The base terminal of transistor 161*d* is coupled to a second terminal of capacitor 155.

It is noted herein, that while FIG. 4 shows an exemplary embodiment utilizing complimentary metal-oxide semiconductor (CMOS) transistors, any transistor technology well known in the art, such as BJT transistors, may be utilized to implement the claimed invention. For example, if bipolar junction transistors (BJT) were utilized instead of CMOS transistors, the CMOS gate terminal couplings would be replaced by BJT base terminal couplings, the CMOS drain terminal couplings would be replace with BJT collector couplings, and the CMOS source terminal couplings would be replaced with BJT emitter couplings.

Gate bias LL1, LL2, HL1 and HL2 differential pair depending on which LNA is active, such as MMM LNA 1 and MMM LNA 2, and whether high linearity (HL) or low linearity (LL) mode is operational.

The exemplary circuit schematic shown in FIG. 4 illustrates the transistor level implementation of multiple LNA circuits, which utilizes only two pairs of degenerative inductors. By sharing a degenerative inductor among multiple high linearity amplifying transistors interfacing multiple receiver inputs and matching networks, the silicon area occupied by the amplifier can be reduced. Most of the area reduction comes from placing the input radio frequency bumps between the load and degenerative inductors rather than placing them next to each other in separate amplifiers with multiple degenerative inductors. For a 160 um distance between the bumps and a 100 um width of the bumps, the width of the die can be reduced by up to 400 um, assuming two amplifiers. In the low linearity modes of operation, multiple amplifying transistors can be replaced with a single transistor interfacing multiple receiver inputs and matching networks through a set of series switches. Further, areas and complexity reduction are due to sharing of the amplifier cascode wand cancellation transistors. Bias circuitry of the amplifying transistors can be shared as well. Moreover, laying out the multiple high linearity amplifying transistors close to each other allows for a single receiver input and matching network to be used if a single receiver is to be configured on a die. The overall layout symmetry of such an amplifier would be yet another asset. Each of the amplifying transistors can be optimized after taking into account the parasitics from the other transistors connected to their gates/sources/drains without sacrificing the performance. A scenario where the degenerative and load inductors are shared between the 450 MHz and 870 MHz amplifying transistors have been simulated with a negligible degradation of the noise figure and triple beat performance.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit (IC) including a multiple multi-mode low-noise amplifier (multi-mode LNA) receiver comprising:
   first and second multi-mode LNAs,
   wherein signal routing through at least one higher linearity transistor gain stage and at least one lower linearity transistor gain stage of each of the first and second multi-mode LNAs is interweaved around shared degenerative inductors and to corresponding common load inductors coupled to outputs of the first and second multi-mode LNAs to optimize die size, reduce noise amplification, and simplify design complexity, and
   wherein the shared degenerative inductors are switchably tapped, on the basis of a desired linearity mode of operation, to set the degenerative inductance to a currently active one of the first and second LNAs.

2. The IC of claim 1, wherein an input of each the first and second multi-mode LNAs is respectively coupled to a corresponding radio frequency (RF) input matching network.

3. The device of claim 2, wherein each RF input matching network corresponds to an associated operating frequency band and is coupled to the corresponding input of the first and second multi-mode LNAs with multiple single-pole single-throw (SPST) RF switches.

4. The IC of claim 1, further comprising multiple lower linearity mode transistor gain stages, wherein the multiple lower linearity mode transistor gain stages are combined into a single lower linearity mode transistor stage through multiple SPST RF switches between a set of RF inputs and matching networks common to the first and second multi-mode LNAs.

5. The IC of claim 1, wherein the at least one higher linearity transistor gain stage and at least one lower linearity transistor gain stage are implemented with RF complementary metal-oxide silicon (RF-CMOS) transistors.

6. The IC of claim 1, wherein the at least one higher linearity transistor gain stage and at least one lower linearity transistor gain stage are each implemented as a differential transistor pair.

7. The IC of claim 1, wherein the first and second multi-mode LNAs share a single cascode transistor pair and a single inter-modulation cancellation (IMC) circuit.

8. A multiple multi-mode LNA receiver comprising:
   first and second means for low noise amplification, wherein signal routing through at least one higher linearity transistor gain stage and at least one lower linearity transistor gain stage of each of the first and second means is interweaved around shared degenerative inductors and to corresponding common load inductors coupled to outputs of the first and second means to optimize die size, reduce noise amplification, and simplify design complexity; and
   inductor tapping means for switchably tapping, on the basis of a desired linearity mode, the shared degenerative inductors to adjust a degenerative inductance to a currently active one of the first and second means.

9. The multiple multi-mode LNA receiver of claim 8, further comprising third means for low noise amplification coupled to the shared degenerative inductors.

10. The multiple multi-mode LNA receiver of claim 8, wherein an input of each the first and second means is respectively coupled to a corresponding radio frequency (RF) input matching network.

11. The multiple multi-mode LNA receiver of claim 10, wherein each RF input matching networks corresponds to an associated operating frequency band and is coupled to the corresponding input of the first and second means with multiple single-pole single-throw (SPST) RF switches.

12. The multiple multi-mode LNA receiver of claim 8, wherein the multiple multi-mode LNA receiver is a wireless communication receiver.

13. The multiple multi-mode LNA receiver of claim 8, wherein the first and second means are part of a single integrated circuit (IC).

14. The multiple multi-mode LNA receiver of claim 8, further comprising multiple lower linearity mode transistor gain stages, wherein the multiple lower linearity mode transistor gain stages are combined into a single lower linearity mode transistor stage through multiple SPST RF switches between a set of RF inputs and matching networks common to the first and second means.

15. The multiple multi-mode LNA receiver of claim 8, wherein the at least one higher linearity transistor gain stage and at least one lower linearity transistor gain stage are implemented with RF complementary metal-oxide silicon (RF-CMOS) transistors.

16. The multiple multi-mode LNA receiver of claim 8, wherein the at least one higher linearity transistor gain stage and at least one lower linearity transistor gain stage s are implemented as a differential transistor pair.

17. The multiple multi-mode LNA receiver of claim 8, wherein the first and second means are coupled to and share a single cascode transistor pair and a single inter-modulation cancellation (IMC) circuit.

* * * * *